(12) United States Patent
Takeshima et al.

(10) Patent No.: US 7,067,959 B2
(45) Date of Patent: Jun. 27, 2006

(54) PIEZOELECTRIC DIAPHRAGM AND PIEZOELECTRIC ELECTROACOUSTIC TRANSDUCER USING THE SAME

(75) Inventors: Tetsuo Takeshima, Toyama (JP); Kiyotaka Tajima, Toyama (JP); Yuji Kosugi, Toyama (JP)

(73) Assignee: Murata Manufacturing Co., LTD., Kyoto (JP)

( * ) Notice: Subject to any disclaimer, the term of this patent is extended or adjusted under 35 U.S.C. 154(b) by 45 days.

(21) Appl. No.: 10/680,572

(22) Filed: Oct. 7, 2003

(65) Prior Publication Data
US 2004/0124748 A1 Jul. 1, 2004

(30) Foreign Application Priority Data
Dec. 27, 2002 (JP) ............................. 2002-379742

(51) Int. Cl.
*H01L 41/08* (2006.01)
(52) U.S. Cl. ................... 310/324; 310/340; 310/344; 310/348
(58) Field of Classification Search ................ 310/324, 310/334, 344, 348, 345, 353, 356
See application file for complete search history.

(56) References Cited

U.S. PATENT DOCUMENTS

| | | | | |
|---|---|---|---|---|
| 6,040,652 | A * | 3/2000 | Kaida ........................... | 310/320 |
| 6,121,718 | A * | 9/2000 | Mohr, III ..................... | 310/334 |
| 6,653,763 | B1 * | 11/2003 | Wang et al. ................. | 310/369 |
| 6,747,396 | B1 * | 6/2004 | Blom .......................... | 310/328 |
| 6,794,799 | B1 * | 9/2004 | Takeshima et al. .......... | 310/348 |
| 2002/0195901 | A1 | 12/2002 | Takleshima et al. | |
| 2004/0085001 | A1 * | 5/2004 | Takeshima ................... | 310/331 |
| 2004/0183407 | A1 * | 9/2004 | Takeshima et al. .......... | 310/331 |

FOREIGN PATENT DOCUMENTS

| DE | 102 33 413 A1 | 3/2003 |
|---|---|---|
| JP | 2001-095094 | 4/2001 |
| JP | 2002-010393 | 1/2002 |

OTHER PUBLICATIONS

Official Communication dated Oct. 12, 2005, issued in the corresponding German Application No. 103 54 026.1-35 (with full English translation).

* cited by examiner

*Primary Examiner*—Mark Budd
(74) *Attorney, Agent, or Firm*—Keating & Bennett, LLP

(57) ABSTRACT

A piezoelectric diaphragm has principal-surface electrodes formed on upper and lower principal surfaces of a multilayer ceramic body. An internal electrode is disposed in an interface between adjacent piezoelectric ceramic layers. The upper and lower principal surfaces of the multilayer ceramic body are substantially entirely covered with a resin layer. A first cutout is formed in a side-edge portion, along the first side surface electrode, of the upper resin layer such that the upper principal-surface electrode is partially exposed in the first cutout. A second cutout is formed in a side-edge portion, along the first side surface electrode, of the lower resin layer such that the lower principal-surface electrode is partially exposed in the second cutout. The locations of the first and second cutouts formed in the upper and lower resin layers, respectively, are selected such that they do not oppose each other.

14 Claims, 10 Drawing Sheets

US 7,067,959 B2

PIEZOELECTRIC DIAPHRAGM AND PIEZOELECTRIC ELECTROACOUSTIC TRANSDUCER USING THE SAME

BACKGROUND OF THE INVENTION

1. Field of the Invention

The present invention relates to a piezoelectric diaphragm for use in a piezoelectric receiver, a piezoelectric sounder, or other suitable apparatus, and also to a piezoelectric electroacoustic transducer including such a piezoelectric diaphragm.

2. Description of the Related Art

Piezoelectric electroacoustic transducers are widely used as piezoelectric sounders, piezoelectric receivers, or other elements in electronic devices, home electronic appliances, portable telephones, or apparatuses. In such piezoelectric electroacoustic transducers, it has been proposed in Japanese Unexamined Patent Application Publication No. 2001-95094 to use a bimorph piezoelectric diaphragm made of multilayer piezoelectric ceramic.

The piezoelectric diaphragm disclosed in Japanese Unexamined Patent Application Publication No. 2001-95094 is in the form of a multilayer ceramic body produced by laminating two or three piezoelectric ceramic layers. Principal-surface electrodes are disposed on upper and lower principal surfaces of the multilayer ceramic body, and an internal electrode is disposed between adjacent ceramic layers. All ceramic layers are polarized in the same transverse direction. The multilayer ceramic body vibrates in the flexure mode in response to an AC signal applied between the internal electrode and the upper and lower principal-surface electrodes. In this piezoelectric diaphragm including two ceramic layers that are disposed one on top of the other, the two ceramic layers function as vibration layers that vibrate in opposite directions. Therefore, this type of piezoelectric diaphragm can be displaced to a greater degree in vibration than the unimorph type of piezoelectric diaphragm, and thus a greater sound pressure can be achieved.

However, because this piezoelectric diaphragm is made of only ceramic layers, the piezoelectric diaphragm is easily broken when a mechanical shock such as a drop impact is applied to it. To solve this problem, Japanese Unexamined Patent Application Publication No. 2002-10393 discloses a piezoelectric diaphragm in which upper and lower surfaces of a multilayer ceramic body are substantially entirely covered with a thin resin layer to reinforce the multilayer ceramic body. This results in a great improvement in resistance against drop impacts. Besides, the resin layers do not influence the flexure vibration of the multilayer ceramic body, and thus, the resin layers do not cause significant changes in the sound pressure and the resonant frequency. The reinforcement of the multilayer ceramic body with the resin layers allows a reduction in thickness of the ceramic layers, which allows a further increase in sound pressure.

FIGS. 8 to 10 show an example of such a piezoelectric diaphragm.

As shown in those figures, the piezoelectric diaphragm 40 includes a multilayer ceramic body 41 formed by laminating two layers 41a and 41b of piezoelectric ceramic such as PZT. Principal-surface electrodes 42 and 43 are formed on the upper and lower principal surfaces, respectively, of the multilayer ceramic body 41. An internal electrode 44 is disposed between ceramic layers 41a and 41b. The two ceramic layers 41a and 41b are polarized in the same thickness direction as represented by arrows P. The principal-surface electrode 42 on the upper principal surface and the principal-surface electrode 43 on the lower principal surface each extend from one side of the multilayer ceramic body 41 to a location close to the other side. In contrast, the internal electrode 44 extends from the other side of the multilayer ceramic body 41 to a location close to the one side. The upper and lower principal surfaces of the multilayer ceramic body 41 are covered with resin layers 45 and 46, respectively.

A side surface electrode 47 is provided on one side surface of the multilayer ceramic body 41 such that the side surface electrode 47 is electrically connected to the principal-surface electrodes 42 and 43. On the opposite side surface of the multilayer ceramic body 41, a side surface electrode 48 is arranged such that the side surface electrode 48 is electrically connected to the internal electrode 44. The upper and lower end portions of the side surface electrode 48 are electrically connected to lead electrodes 49 provided on the side edges of the upper and lower surfaces of the multilayer ceramic body 41. Cutouts 45a and 46a are formed in the respective resin layer 45 and 46 such that the principal-surface electrodes 42 and 43 on the upper and lower principal surfaces are partially exposed in the cutouts 45a and 46a, and cutouts 45b and 46b are formed in the respective resin layer 45 and 46 such that the lead electrodes 49 are partially exposed in the cutouts 45b and 46b. The piezoelectric diaphragm 40 is put in a case with terminals, and the electrodes exposed in the cutouts 45a and 45b formed in the resin layer 45 on the upper principal surface are connected, via conductive adhesives, to respective terminals exposed inside the case thereby achieving electrical connections between the piezoelectric diaphragm 40 and the terminals.

In the piezoelectric diaphragm 40 constructed in the above-described manner, the cutouts 45a, 46a, 45b, and 46b are formed in the resin layers 45 and 46 such that the cutouts 45a and 45b are located at the center of one side edge of the respective resin layers 45 and 46 and thus, they oppose each other in a direction across thickness of the resin layers 45 and 46, while the cutouts 45b and 46b are located at the center of the opposite side edge of the respective resin layers 45 and 46 and thus, they oppose each other in the direction across thickness of the resin layers 45 and 46. The cutouts 45a and 46a are formed in the upper and lower resin layers 45 and 46 such that the principal-surface electrodes 42 and 43 on the upper and lower principal surfaces are partially exposed in the cutouts 45a and 46a for the following reasons. The side surface electrodes 47 and 48 are formed after the resin layers 45 and 46 are formed on the upper and lower principal surfaces of the multilayer ceramic body 41. However, because the principal-surface electrodes 42 and 43 are formed of thin films, very small areas of the principal-surface electrodes 42 and 43 are exposed between the resin layers 45 and 46 and the ceramic layer 41a and 41b. Therefore, if the side surface electrode 47 is simply formed on the side surface of the piezoelectric diaphragm 40, reliable electrical connections between the side surface electrode 47 and the principal-surface electrodes 42 and 43 cannot be achieved. To avoid this problem, cutouts 45a and 46a are formed in sides, along the side surface electrode 47, of the upper and lower resin layer 45 and 46, and the side surface electrode 47 is formed such that a portion of the side surface electrode 47 extends on the surface of the principal-surface electrodes 42 and 43 thereby achieving reliable electrical connections. Although in this example, the cutouts 45b and 46b for exposing the lead electrode 49 therein are formed in both upper and lower resin layers 45 and 46 in order to achieve symmetry in structure, the cutout 46b in the lower resin layer 46 is not necessarily needed.

However, because cutouts 45a, 46a, 45b, and 46b are formed at opposing locations in the upper and lower resin layers 45 and 46, if a mechanical shock is applied to the piezoelectric diaphragm 40, for example, due to dropping, cracks are often created in portions of the multilayer ceramic body 41 exposed in the cutouts. This problem becomes more serious, in particular, when the thickness of the multilayer ceramic body 41 is reduced. In FIG. 10, broken lines CR represent locations where cracks are produced. A cause of cracks is stress produced by contraction of the conductive adhesive which occurs when the adhesive is cured, and the stress is applied to the electrodes exposed in the cutouts formed in the resin layers 45 and 46. Another cause of cracks is that when a drop impact is applied, impact force to the case is intensely applied via the conductive adhesive to the portions of the electrodes exposed via the cutouts formed in the resin layers 45 and 46. Still another reason for the cracks is that the provision of the cutouts 45a, 46a, 45b, and 46b results in a reduction in the mechanical strength of the multilayer ceramic body 41.

SUMMARY OF THE INVENTION

In order to overcome the problems described above, preferred embodiments of the present invention provide a piezoelectric diaphragm having reliable electrical connections between a side surface electrode and upper and lower principal-surface electrodes and having improved resistance against mechanical shocks, and also provide a piezoelectric electroacoustic transducer including such a novel piezoelectric diaphragm.

According to a preferred embodiment of the present invention, a piezoelectric diaphragm includes a multilayer ceramic body having a substantially rectangular shape and including a plurality of piezoelectric ceramic layers, principal-surface electrodes disposed on upper and lower principal surfaces of the multilayer ceramic body, and an internal electrode disposed in an interface between adjacent piezoelectric ceramic layers, whereby flexure vibration occurs in the piezoelectric diaphragm when an AC signal is applied between the internal electrode and the upper and lower principal-surface electrodes, the upper and lower principal-surface electrodes being electrically connected to each other via a first side surface electrode disposed on one side surface of the multilayer ceramic body, the internal electrode being electrically connected to a second side surface electrode disposed on a side surface that is different from the side surface on which the first side surface electrode is disposed, the second side surface electrode being electrically connected to a lead electrode disposed on at least on the upper principal surface of the multilayer ceramic body, the upper and lower principal surfaces of the multilayer ceramic body being substantially entirely covered with a resin layer, a first cutout being formed in a side-edge portion, along the first side surface electrode, of the upper resin layer such that the upper principal-surface electrode is partially exposed in the first cutout, a second cutout being formed in a side-edge portion, along the first side surface electrode, of the lower resin layer such that the lower principal-surface electrode is partially exposed in the second cutout, and a third cutout being formed in a side-edge portion, along the second side surface electrode, of the upper resin layer such that the lead electrode is exposed in the third cutout, wherein the first and second cutouts formed in the upper and lower resin layers, respectively, are at locations that are not opposite to each other.

The major reason why cracks are created in portions exposed in cutouts of the multilayer ceramic body when a mechanical shock due to dropping or other phenomenon is applied to the multilayer ceramic body is that the cutouts formed in the upper and lower resin layers at locations opposing each other cause a reduction in mechanical strength of the portion exposed in the cutouts. In preferred embodiments of the present invention, to avoid the above-described problems, the cutouts are formed in the upper and lower resin layers such that their locations do not oppose each other in the direction across the thickness of the resin layers. That is, each of the resin layers has no cutout at a location opposing a location at which a cutout is formed in the other resin layer, thereby minimizing the reduction in the mechanical strength due to the provision of the cutouts. The arrangement of the locations of the cutouts such that the cutouts are not opposite to each other results in a dramatic improvement in the resistance against mechanical shocks.

Note that in this structure, preferably there are still cutouts in both upper and lower resin layers, and thus the side surface electrode can contact the upper and lower principal-surface electrodes over wide surface areas, thereby ensuring that highly reliable electrical contacts between the side surface electrode and the upper and lower principal-surface electrodes are achieved.

In this piezoelectric diaphragm, preferably, the first cutout formed in the side-edge portion, along the first side surface electrode, of the upper resin layer is located near one end of the side-edge portion, the second cutout formed in the side-edge portion, along the first side surface electrode, of the lower upper resin layer is located near the opposite end of the side-edge portion, and the third cutout formed in the side-edge portion, along the second side surface electrode, of the upper resin layer is located near either one of the two ends of the side-edge portion.

When the piezoelectric diaphragm is housed in a case or other container and the electrodes of the piezoelectric diaphragm are connected to terminals or other conductive members, it is desirable to minimize the constraints imposed on the piezoelectric diaphragm. To meet this requirement, the first to third cutouts are preferably formed in the vicinity of ends of the side edges, along the side surface electrodes, of the resin layers. That is, the cutouts are preferably formed near corners of the resin layers, thereby ensuring that the electrodes of the piezoelectric diaphragm are connected to terminals without exerting significant influence on vibrations of the piezoelectric diaphragm. In particular, the large separation between the first and second cutouts formed at opposite ends of the same side prevents stress in one cutout portion from influencing the other cutout portion. This results in a great reduction in probability that cracks are created.

The present invention also provides a piezoelectric electroacoustic transducer including the piezoelectric diaphragm described above, a housing in which the piezoelectric diaphragm is housed, the housing having a supporting portion for supporting the piezoelectric diaphragm at two opposing sides of the piezoelectric diaphragm or at corners of the piezoelectric diaphragm or over the entire perimeter of the piezoelectric diaphragm, a pair of terminals, one end portion of each of the pair of terminals being exposed at a location near the supporting portion on the inner side wall of the housing, the other end portion of each of the pair of terminals being exposed on the outer surface of the housing, wherein a portion of the upper principal-surface electrode exposed in the first cutout is connected to the one end portion of one terminal via a conductive adhesive, and the lead electrode, exposed in the third cutout is connected to one end portion of the other terminal via a conductive adhesive.

When the electrodes of the piezoelectric diaphragm are connected to terminals of the case, it is desirable to use a conductive adhesive for connection to achieve high workability, high connection reliability, and small size. In the piezoelectric diaphragm according to preferred embodiments of the present invention, because the principal-surface electrodes and the lead electrode are exposed in the first to third cutouts formed in the upper and lower resin layers, electrical connections between the electrodes and the terminals can be easily achieved by applying a conductive adhesive using a dispenser or other suitable mechanism, to the electrodes exposed in the cutouts after the piezoelectric diaphragm is put in the case.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
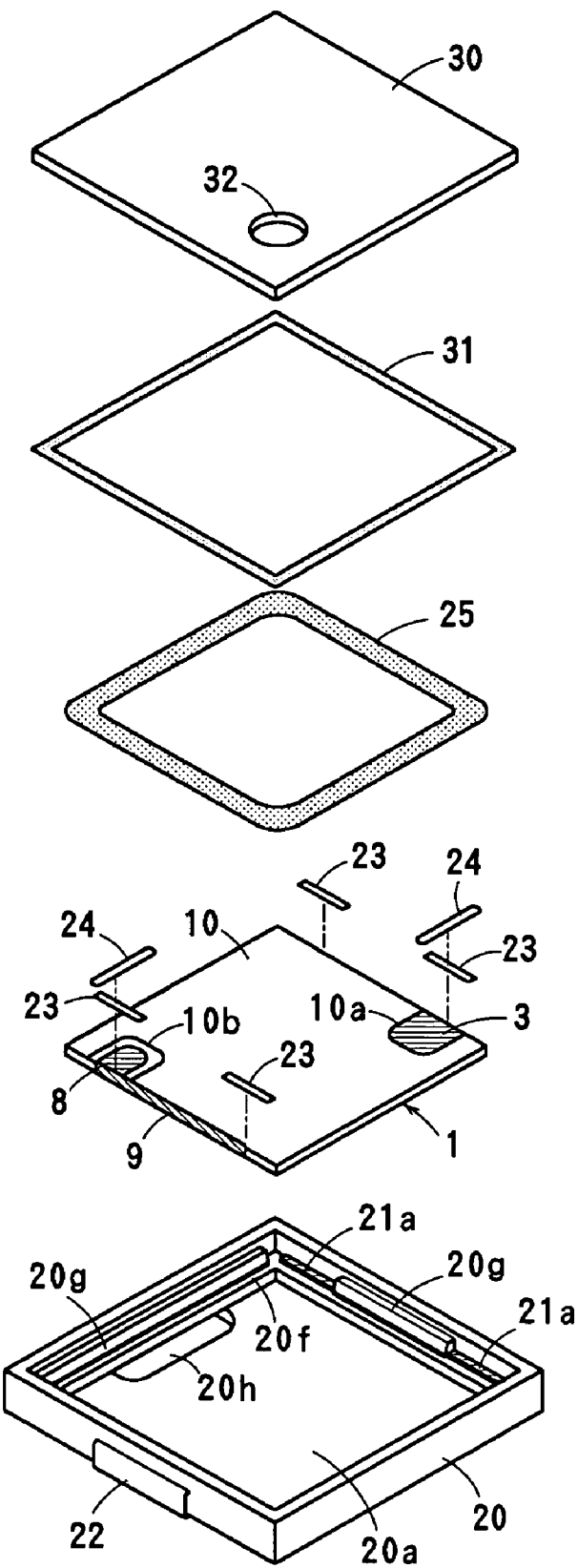
FIG. 1 an exploded perspective view of a piezoelectric electroacoustic transducer according to a first preferred embodiment of the present invention.
Figure 2:
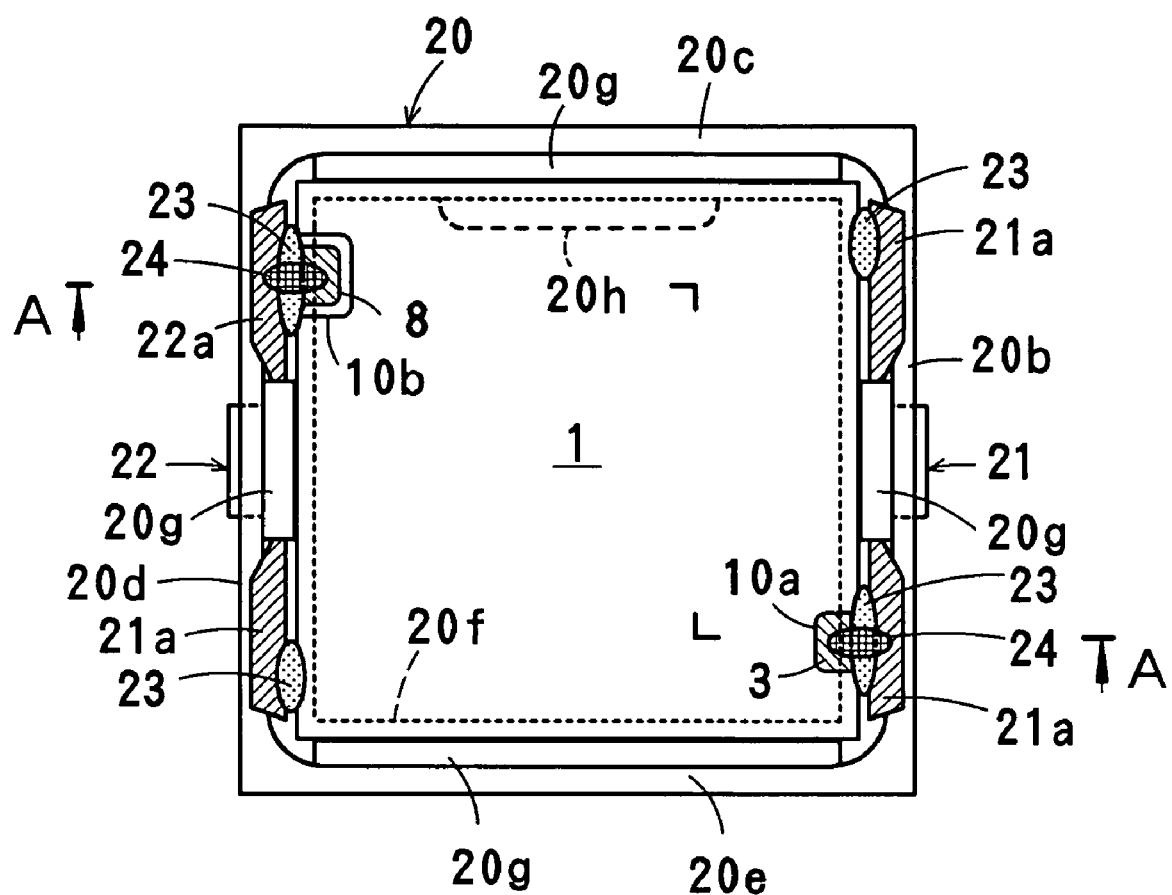
FIG. 2 is a plan view of the piezoelectric electroacoustic transducer shown in FIG. 1, in a state in which a lid and an elastic sealing agent are removed.
Figure 3:
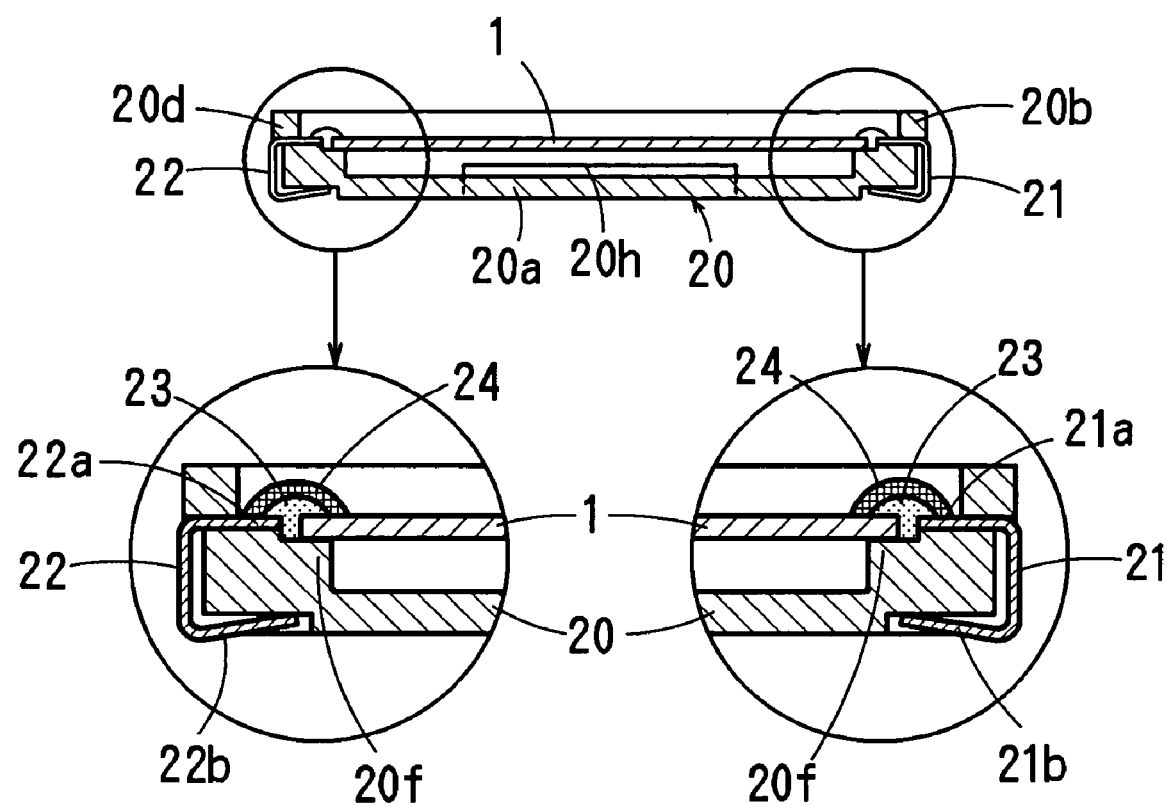
FIG. 3 is a cross-sectional view taken along a stepped line A—A of FIG. 2.

FIGS. 1 to 3 show a piezoelectric electroacoustic transducer of the surface mounting type according to a first preferred embodiment of the present invention.

This electroacoustic transducer according to the present preferred embodiment is suitable for use in applications such as a piezoelectric receiver in which the electroacoustic transducer needs to operate over a wide frequency range. The electroacoustic transducer includes a piezoelectric diaphragm 1, a case 20, and a lid 30. The case 20 and the lid 30 define a housing.

Figure 4:
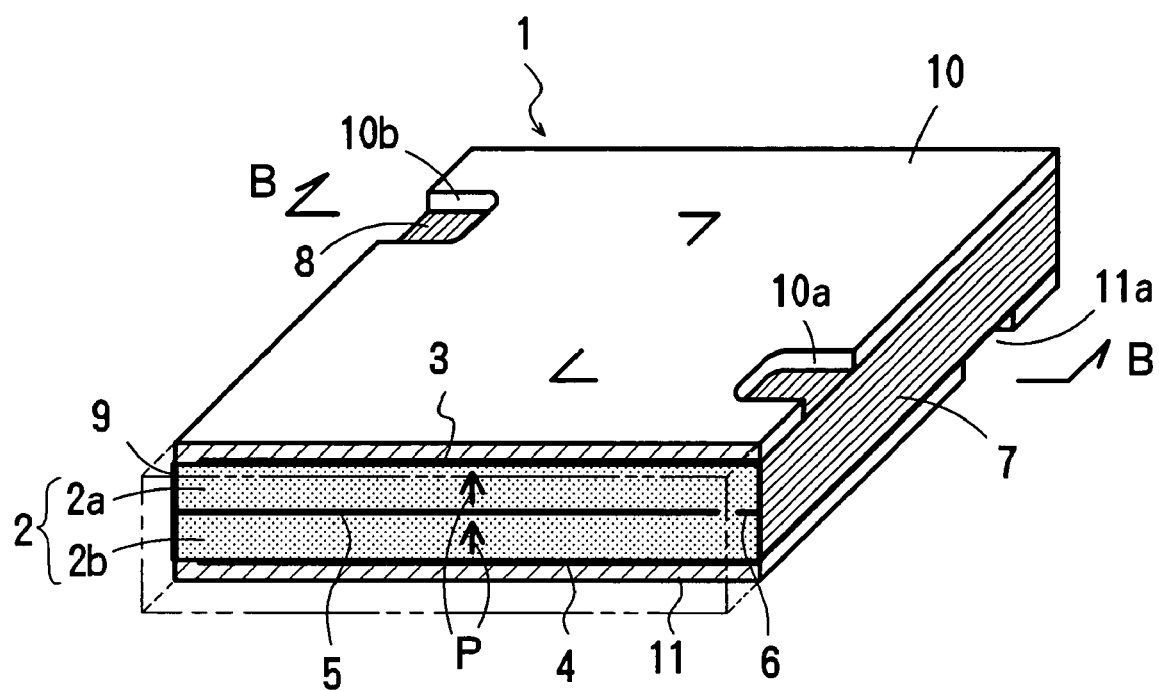
FIG. 4 is a perspective view of a piezoelectric diaphragm included in the piezoelectric electroacoustic transducer shown in FIG. 1.
Figure 5:
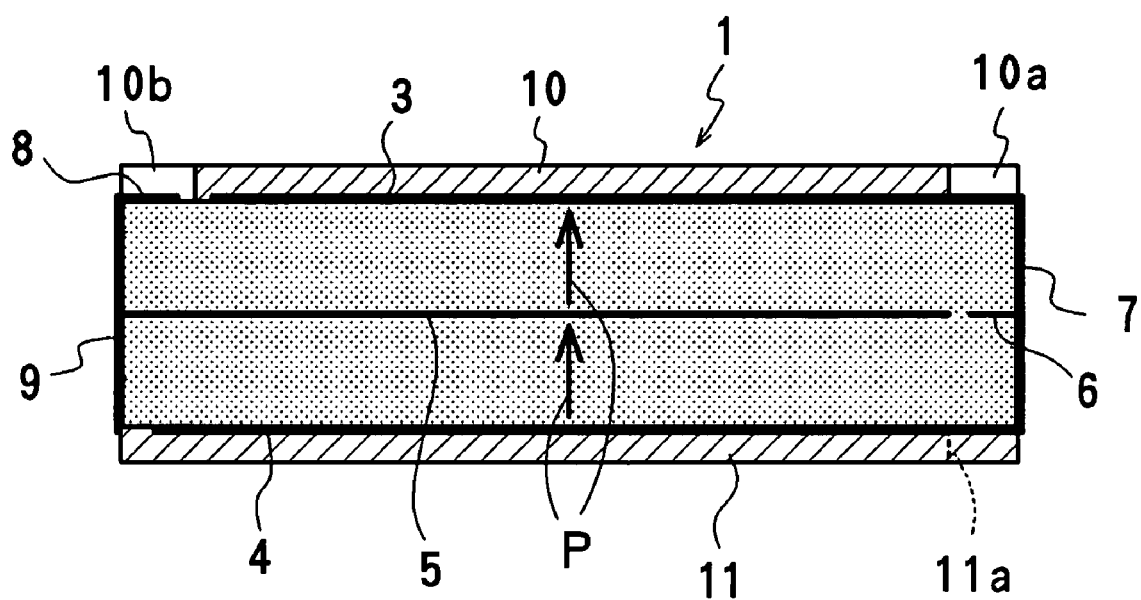
FIG. 5 is a cross-sectional view taken along a stepped line B—B of FIG. 4.
Figure 6:
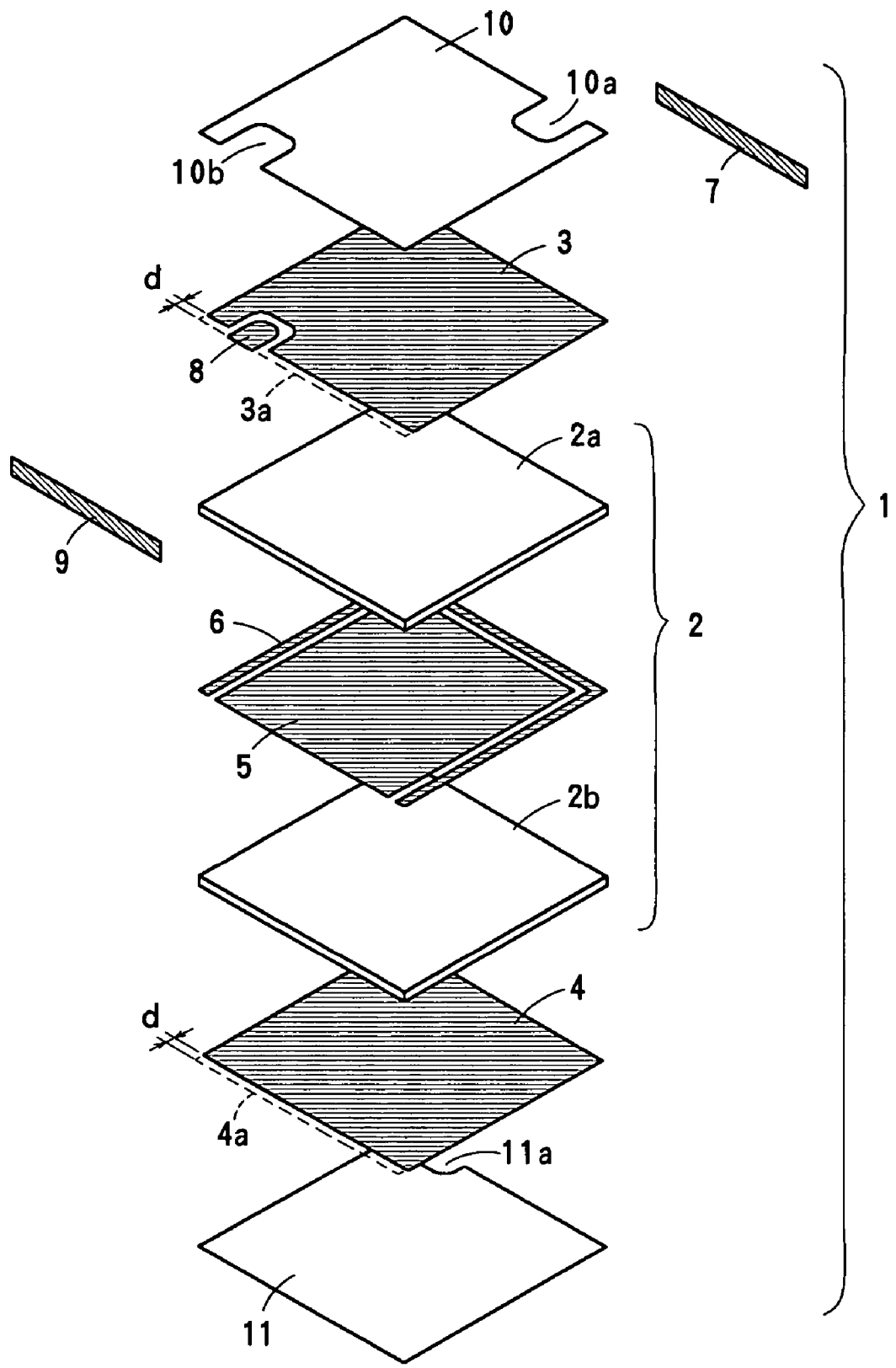
FIG. 6 is an exploded perspective view of the piezoelectric diaphragm shown in FIG. 4.

As shown in FIGS. 4 to 6, the piezoelectric diaphragm 1 includes a substantially rectangular-shaped multilayer ceramic body 2 that is preferably formed by laminating two piezoelectric ceramic layers 2a and 2b, although more layers may be used. Principal-surface electrodes 3 and 4 are disposed on upper and lower principal surfaces of the multilayer ceramic body 2. An internal electrode 5 and a dummy electrode 6 is disposed between the ceramic layers 2a and 2b. The two ceramic layers 2a and 2b are preferably polarized in the same thickness direction as represented by arrows P. As shown in FIG. 6, a recess 3a with a width of d is formed on one side of the upper principal-surface electrode 3, and a similar recess 4a is formed on one side of the lower principal-surface electrode 4. The remaining three sides of each principal-surface electrode extend until they reach side surfaces of the multilayer ceramic body 2. One side, extending to a side surface of the multilayer ceramic body 2, of the principal-surface electrode 3 and a corresponding side of the principal-surface electrode 4 are electrically connected to each other via the side surface electrode 7 disposed on the side surface of the multilayer ceramic body 2. On the same side of the surface of the multilayer ceramic body 2 as the side of the upper principal-surface electrode 3 where the recess 3a is formed, a lead electrode 8 is arranged such that the lead electrode 8 is spaced by a gap from the principal-surface electrode 3. The internal electrode 5 preferably has a substantially rectangular shape such that the internal electrode 5 is exposed only at the same side of the multilayer ceramic body 2 as the side where recesses 3a and 4a are formed in the principal-surface electrodes 3 and 4. The dummy electrode 6 preferably has the shape of an incomplete rectangular frame lacking one side, and the dummy electrode 6 is disposed such that three sides of the internal electrode 5 are surrounded by the dummy electrode 6 via a gap. The dummy electrode 6 is exposed at four side surfaces of the multilayer ceramic body 2, wherein at one side surface of the multilayer ceramic body 2, the internal electrode 5 is also exposed. The internal electrode 5 is connected to the lead electrode 8 via the side surface electrode 9 disposed on a side surface opposite to the side surface on which the side-face electrode 7 is located. The side surface electrode 9 has a length that is smaller than the length of one side of the multilayer ceramic body 2 so that the side surface electrode 9 is not electrically connected to the dummy electrode 6.

The electrodes 3 to 9 are preferably thin films.

In FIG. 4, the piezoelectric diaphragm 1 is cross-sectioned along a plane located slightly back from the front side surface.

The dummy electrode 6 is provided for the following reason. If the internal electrode 5 is arranged so as to extend to the four side edges of the multilayer ceramic body 2, then, on the side surfaces of the multilayer ceramic body 2, the edges of the internal electrode 5 are located in close vicinity of the edges of the principal-surface electrodes 3 and 4. This can cause migration that may result in a short circuit. The provision of the dummy electrode 6 surrounding the internal electrode 5 via the gap prevents the internal electrode 5 from being electrically connected to the principal-surface electrodes 3 and 4 due to migration.

The side surface electrode 7 is connected not only with the principal-surface electrodes 3 and 4 but also with the dummy electrode 6. The electrical connection with the dummy electrode 6 results in no problem in electronic characteristics, because the dummy electrode 6 is electrically isolated from the internal electrode 5.

In order to prevent the multilayer ceramic body 2 from being broken due to a drop impact, the upper and lower principal-surface electrodes 3 and 4 disposed on the upper and lower surfaces of the multilayer ceramic body 2 are covered with the resin layers 10 and 11, respectively. In the upper resin layer 10, the first cutout 10a and the third cutout 10b are formed at locations near diagonally opposing corners of the upper resin layer 10 such that the principal-surface electrode 3 is partially exposed in the first cutout 10a and the lead electrode 8 is exposed in the third cutout 10b. In the lower resin layer 11, the second cutout 11a is formed near a corner that is different from the corners where the first and third cutouts are formed such that the principal-surface electrode 4 is partially exposed in the second cutout 11a. In this structure, the location of the first cutout 10a formed on the same side of the upper resin layer 10 as the side surface of the multilayer ceramic body 2 where the side surface electrode 7 is formed and the location of the second cutout 11a formed in the lower resin layer 11 are selected such that those locations are not opposite to each other in the direction across the thickness of the multilayer ceramic body 2.

In the present preferred embodiment, the ceramic layers 2a and 2b are each preferably formed of a PZT ceramic with, for example, a size of approximately 10 mm×10 mm×15 μm (wherein the total thickness of the ceramic layers 2a and 2b is about 30 μm). The resin layers 10 and 11 are each preferably formed of a polyamide-imide resin with a thickness of about 3 μm to 10 μm.

To eliminate the difference in structure between the upper and lower surfaces, a lead electrode and a cutout in the resin layer 11 may be formed on the lower surface of the multilayer ceramic body 2. In this case, it is desirable that the lead electrode and the cutout be located near a corner opposite to the corner where the cutout 11a is located.

Although in the present preferred embodiment, the lead electrode 7 preferably is island-shaped corresponding to the cutout 10b, the lead electrode 7 may be formed in the shape of a band with a small width.

The shapes of the cutouts 10a, 10b, and 11a are not limited to those used in the present preferred embodiment.

The piezoelectric diaphragm 1 may be produced, for example, as follows.

First, two ceramic sheets having a large size for producing a large number of piezoelectric diaphragms that will be divided into individual piezoelectric diaphragms later, are provided. The internal electrode 5 and the dummy electrode 6 are placed on one of the two ceramic sheets, and the other ceramic plate is placed thereon such that the internal electrode 5 and the dummy electrode 6 are disposed between the two ceramic layers. After sintering, the principal-surface electrodes 3 and 4 and the lead electrode 8 are formed on the upper and lower surface of the multilayer structure by sputtering or other suitable process. The resin layers 10 and 11 having windows that will form cutouts are formed on the upper and lower surfaces of the multilayer ceramic body by screen printing or other suitable process. Thereafter, the resultant structure is cut in horizontal and vertical directions thereby dividing it into individual pieces of multilayer ceramic bodies (with resin layers). Thereafter, side surface electrodes 7 and 9 are disposed on two opposite side surfaces of the individual pieces of multilayer ceramic bodies by sputtering or other suitable process thereby obtaining piezoelectric diaphragms 1 in the form shown in FIG. 4.

The case 20 is preferably made of a resin material in the form of a substantially rectangular box with a bottom wall 20a and four side walls 20b to 20e. Preferable examples of the resin material include a LCP (liquid crystal polymer), SPS (syndiotactic polypropylene), PPS (polyphenylene sulfide), epoxy, or similar heat resistant resins. A ring-shaped supporting portion (step) 20f is provided on the inner surface of each of the four side walls 20b to 20e. Inner connection portions 21a and 22a of a pair of terminals 21 and 22 are exposed on the inner surface of the opposing two side walls 20b and 20d, at locations above the supporting portion 20f. Each of the inner connection portions 21a and 22a of the respective terminals 21 and 22 has two branches extending in opposite directions in corners of the piezoelectric diaphragm 1. The terminals 21 and 22 are formed by insert molding or other suitable process so as to be embedded in the side walls of the case 20. The terminals 21 and 22 have outer connection portions 21b and 22b, respectively exposed on the outer surface of the case 20, wherein each of the outer connection portions 21b and 23b has a portion bent along the outer surface of the side wall 20b or 20d so as to partially extend on the back surface of the case 20.

As shown in FIGS. 1 and 2, guide walls 20g in the form of protrusions for positioning the four sides of the piezoelectric diaphragm 1 are formed on the inner surface of the four side walls 20b to 20e. When the piezoelectric diaphragm 1 is put into the case 20, the four sides of the piezoelectric diaphragm 1 are guided by the guide walls 20g and the piezoelectric diaphragm 1 is precisely positioned on the supporting portion 20f. In this position, the upper surface of the piezoelectric diaphragm 1 and the upper surfaces of the inner connection portions 21a and 22a of the terminals 21 and 22 become substantially flush with each other.

A first sound hole 20h is formed in the bottom wall 20a.

The piezoelectric diaphragm 1 housed in the case 20 is firmly connected, at four locations, to the inner connection portions 21a and 22a of the terminals 21 and 22 via elastic supporting agents 23 and conductive adhesives 24. More specifically, the elastic supporting agents 23 are coated at two diagonally opposing locations, that is, at a location between the principal-surface electrode 3 exposed in the first cutout 10a and one inner connection portion 21 a of the terminal 21 and at a location between the lead electrode 8 exposed in the third cutout 10b and one inner connection portion 22a of the terminal 22. Although in the present preferred embodiment, the elastic supporting agents 23 are also coated at the remaining two diagonally opposing locations, those elastic supporting agents 23 are not necessarily needed. Furthermore, although in the present preferred embodiment, the elastic supporting agents 23 are coated along straight or curved lines on side edges of the piezoelectric diaphragm 1, the elastic supporting agents 23 may be coated in a different manner. A specific example of an agent for the elastic supporting agents 23 is a soft elastic agent such as a polyurethane resin having a Young's modulus of, for example, about $3.7 \times 10^6$ Pa as measured after being cured.

The elastic supporting agents 23 preferably have high viscosity before being cured, and thus the elastic supporting agents 23 do not spread when they are coated. That is, the elastic supporting agents 23 do not flow down to the supporting portion 20f via the gap between the piezoelectric diaphragm 1 and the case 20. After the elastic supporting agents 23 are coated, the elastic supporting agents 23 are cured by heating them.

The piezoelectric diaphragm 1 may also be fixed by coating the elastic supporting agents 23 using a dispenser or the like after the piezoelectric diaphragm 1 is put in the case 20. Alternatively, the elastic supporting agents 23 may be coated on the piezoelectric diaphragm 1 and then the piezoelectric diaphragm 1 may be put into the case 20.

After the elastic supporting agents 23 are cured, the conductive adhesives 24 are coated along straight or curved lines crossing the elastic supporting agents 23 thereby connecting the principal-surface electrode 3 and the inner connection portion 21a of the terminal 21 with each other and also connecting the lead electrode 8 and the inner connection portion 22a of the terminal 22 with each other. A specific example of an agent for the conductive adhesives 24 is a polyurethane conductive paste having a Young's modulus of, for example, about $0.3 \times 10^9$ Pa as measured after being cured. After the conductive adhesives 24 are coated, the conductive adhesives 24 are cured by heating them. Note that the conductive adhesives 24 may be coated in a different manner as long as the principal-surface electrode 3 and the inner connection portion 21a are connected with each other and the lead electrode 8 and the inner connection portion 22a are connected with each other via the conductive adhesives 24 extending over the elastic supporting agents 23.

After the conductive adhesives 24 are coated and cured, an elastic sealing agent 25 is coated such that the gap between the piezoelectric diaphragm 1 and the inner surface of the case 20 is filled with the elastic sealing agent 25 along the entire perimeter of the piezoelectric diaphragm 1 thereby preventing air from flowing between the space on the upper side of the piezoelectric diaphragm 1 and the space on the lower side of the piezoelectric diaphragm 1. After the elastic sealing agent 25 is coated along the periphery of the piezoelectric diaphragm 1 in the above describe manner, the elastic sealing agent 25 is cured by heating.

A specific example of an agent for the elastic sealing agent 25 is a soft elastic material such as a silicone adhesive having a Young's modulus of, for example, about $3.0 \times 10^5$ Pa as measured after being cured.

After the piezoelectric diaphragm 1 is fixed in the case 20, the lid 30 is bonded to the case 20 via an adhesive 31 such that the upper opening of the case 20 is closed with the lid 30. The lid 30 is made of a material similar to that of the case 20. By closing the opening of the case 20 with the lid 30, an acoustic space is created between the lid 30 and the piezoelectric diaphragm 1. The lid 30 has a second sound hole 32.

Via the process described above, a completed piezoelectric electroacoustic transducer of the surface mounting type is obtained.

In this electroacoustic transducer according to the present preferred embodiment, if an AC signal is applied between the terminals 21 and 22, area vibration in the flexure vibration mode occurs in the piezoelectric diaphragm 1. When the polarization and the applied electric field are in the same direction, the piezoelectric ceramic layer contracts longitudinally. On the other hand, when the polarization and the applied electric field are opposite in direction, the piezoelectric ceramic layer expands longitudinally. As a result, the piezoelectric ceramic layer flexes in transverse directions. Although the upper and lower surfaces of the multilayer ceramic body 2 are covered with the resin layers 10 and 11, the resin layers 10 and 11 do not influence the flexure vibration of the multilayer ceramic body 2 because the resin layers 10 and 11 are very thin. That is, the resin layers 10 and 11 do not cause significant changes in the sound pressure and the resonant frequency.

Table 1 shows a result of a drop test performed on samples of electroacoustic transducers.

TABLE 1

| Drop test height (cm) | Known technique | Present Invention |
|---|---|---|
| 100 | ○ | ○ |
| 120 | X | ○ |
| 150 | X | ○ |
| 180 | X | ○ |

Figure 8:
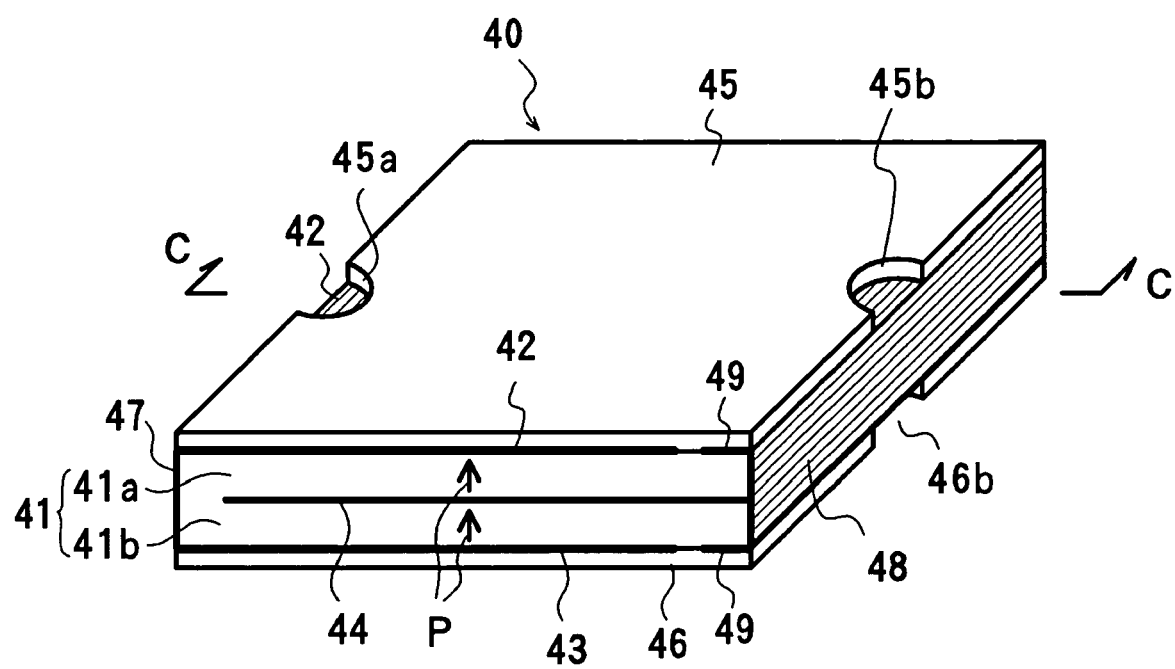
FIG. 8 a perspective view of a piezoelectric diaphragm according to a known technique.
Figure 9:
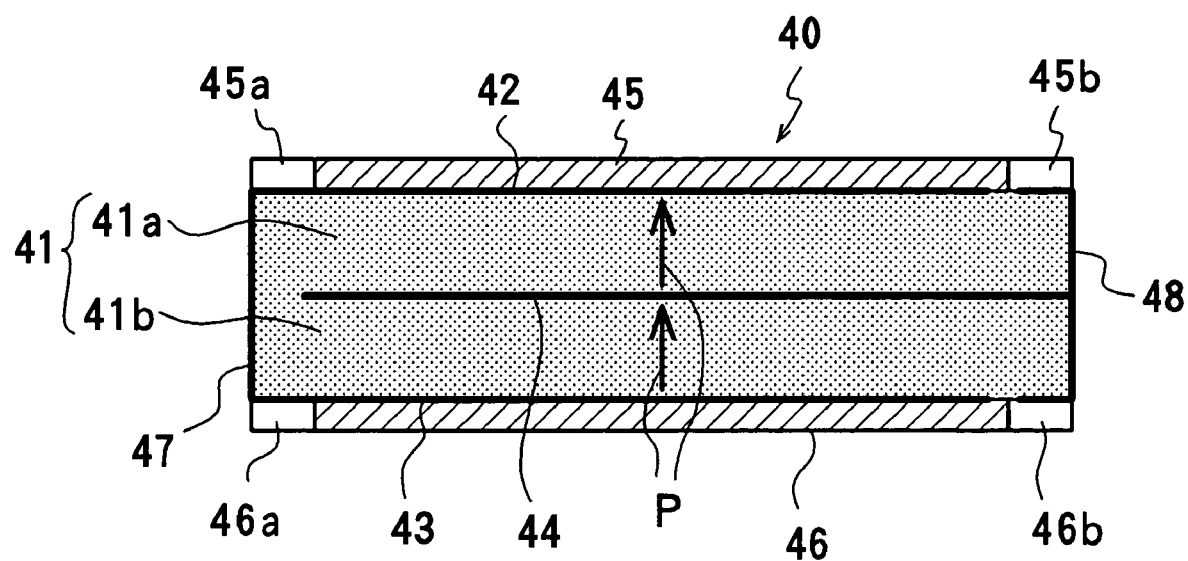
FIG. 9 is a cross-sectional view taken along line C—C of FIG. 8.
Figure 10:
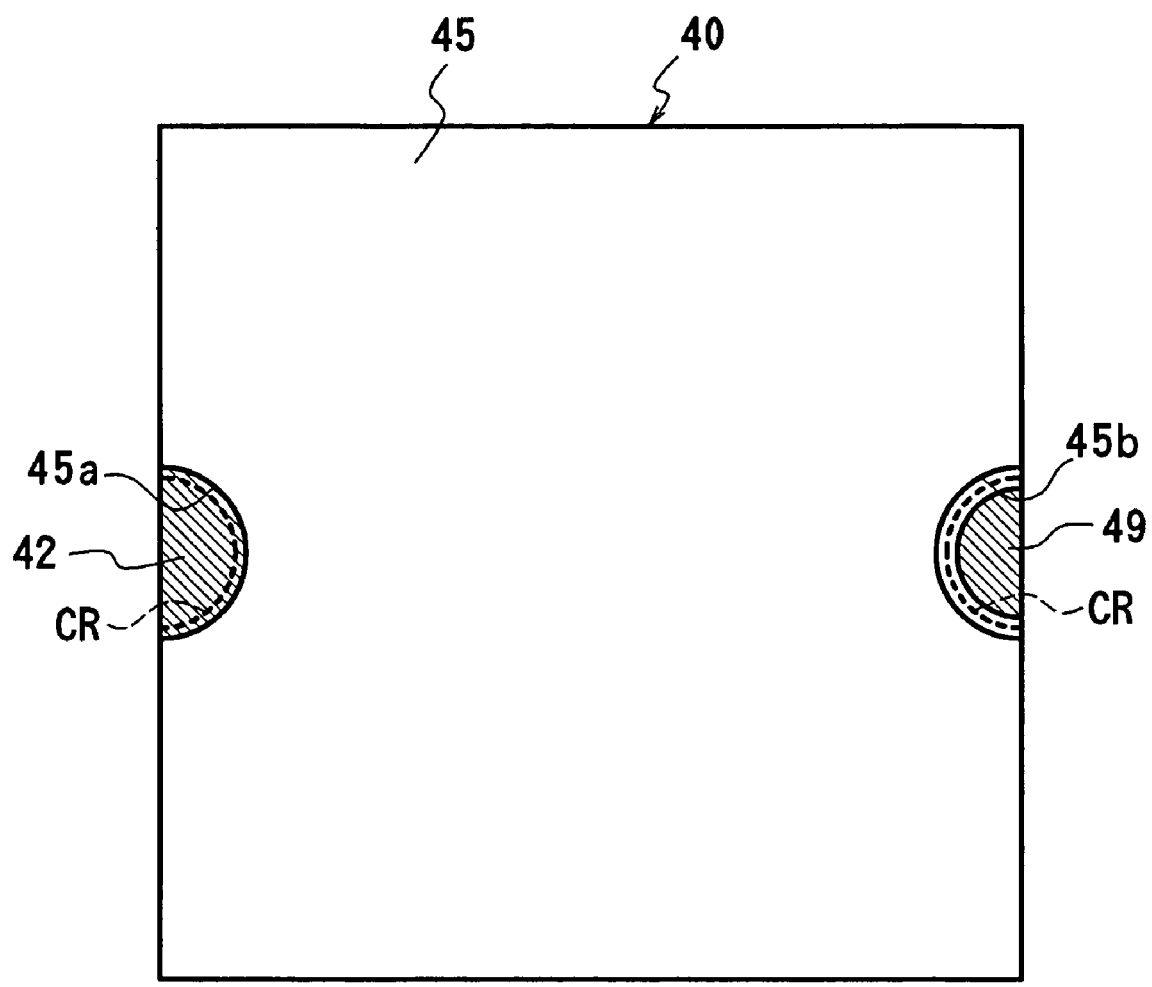
FIG. 10 is a plan view of the piezoelectric diaphragm shown in FIG. 8.

In Table 1, "known technique" refers to the electroacoustic transducer using the piezoelectric diaphragm shown in FIGS. 8 to 10 according to the known technique, and "Present Invention" refers to the electroacoustic transducer using the piezoelectric diaphragm shown in FIGS. 4 to 6 according to preferred embodiments of the present invention.

The drop test was carried out on six surfaces in one cycle, and the test was performed five cycles. After samples were subjected to dropping, samples were examined to determine whether cracks were created in the cutout parts of the piezoelectric diagram. The samples have no difference except for the locations of cutouts, and the tests were performed under the same conditions for all samples. In Table 1, ○ indicates that no crack were observed, and x indicates that cracks were observed.

As can be seen from Table 1, in the case of samples having the known structure, cracks were created when samples were dropped from heights higher than 120 cm. In contrast, no cracks were created in the sample according to preferred embodiments of the present invention even when samples were dropped from a height of 180 cm. Thus, it turns out that the structure according to preferred embodiments of the present invention is very effective to improve the mechanical strength.

Figure 7:
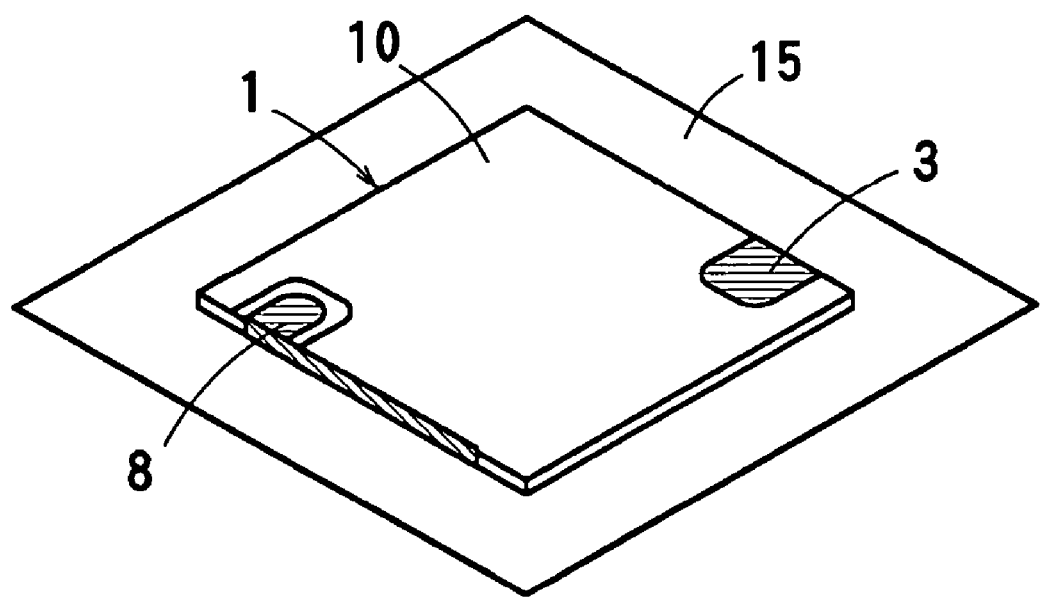
FIG. 7 is a perspective view of a piezoelectric diaphragm according to another preferred embodiment of the present invention.

Referring to FIG. 7, another preferred embodiment of a piezoelectric diaphragm according to the present invention is described below.

In this preferred embodiment, the piezoelectric diaphragm 1 described above with reference to FIGS. 4 to 6 is bonded to a resin film 15 having a greater size than the piezoelectric diaphragm 1. Preferably, the resin film 15 is made of a material having a Young's modulus in the range of about 500 MPa to about 15000 MPa with a thickness of about 5 μm to about 10 μm. Specific examples of materials are an epoxy resin, acrylic resin, polyimide resin, and polyamide-imide resin.

After the piezoelectric diaphragm 1 is bonded to the center of the large-size resin film 15, if the peripheral portion of the resin film 15 is fixed to a supporting portion of a case, the piezoelectric diaphragm 1 can be supported without strongly constraining the piezoelectric diaphragm 1. This allows the piezoelectric diaphragm 1 to vibrate more easily. That is, the piezoelectric diaphragm 1 can be displaced to a greater degree in vibration, and thus a greater sound pressure can be achieved. Furthermore, the same resonant frequency can be obtained using a piezoelectric diaphragm 1 with a smaller size. The flat sound pressure can be obtained over a wide frequency range from the fundamental harmonic to the third-order harmonic. That is, it is possible to produce a sound over a wide frequency range.

Note that the present invention is not limited to the specific examples described above, but various modifications are possible without departing from the scope of the present invention.

For example, although in the preferred embodiments described above, the piezoelectric diaphragm preferably has two piezoelectric ceramic layers, the multilayer structure may include three or more piezoelectric ceramic layers.

Furthermore, although in the preferred embodiments described above, the supporting portion 20f for supporting the four sides of the piezoelectric diaphragm 1 preferably is disposed on the inner surface of the side walls of the case 20 over the entire inner perimeter of the case 20, the supporting portion 20f may be formed such that the piezoelectric diaphragm 1 is supported at two sides or at four corners.

The housing used in the present invention is not limited to that formed by covering a box-shaped case with a lid, such as that used in the above-described preferred embodiments, but any other housing may also be used as long as a piezoelectric diaphragm can be housed and external terminal or electrodes are provided.

As can be understood from the above description, the present invention provides great advantages. That is, because the first and second cutouts are formed in the resin layers formed on the upper and lower surface of the piezoelectric diaphragm such that the cutouts do not oppose each other in the direction across the thickness of the piezoelectric diaphragm, no cracks are created in the parts exposed in the cutouts when drop impact is applied to the piezoelectric diaphragm disposed in the housing. That is, a great improvement in resistance against mechanical shock such as drop impact is achieved. Furthermore, the side surface electrode can have contact over wide surface areas with the upper and lower principal-surface electrodes via the cutouts formed in the upper and lower resin layers, thereby ensuring that highly reliable electric contacts between the side surface electrode and the upper and lower principal-surface electrodes are achieved.

While preferred embodiments of the invention have been described above, it is to be understood that variations and modifications will be apparent to those skilled in the art without departing the scope and spirit of the invention. The scope of the invention, therefore, is to be determined solely by the following claims:

What is claimed is:

1. A piezoelectric diaphragm comprising:
   a multilayer ceramic body including a plurality of piezoelectric ceramic layers, principal-surface electrodes disposed on upper and lower principal surfaces of the multilayer ceramic body, and an internal electrode provided at an interface between adjacent piezoelectric ceramic layers; wherein
   flexure vibration occurs in the piezoelectric diaphragm when an AC signal is applied between the internal electrode and the upper and lower principal-surface electrode;
   the upper and lower principal-surface electrodes are electrically connected to each other via a first side surface electrode disposed on one side surface of the multilayer ceramic body;
   the internal electrode is electrically connected to a second side surface electrode disposed on a side surface that is different from the side surface on which the first side-face electrode is provided;
   the second side surface electrode is electrically connected to a lead electrode disposed on at least on the upper principal surface of the multilayer ceramic body;
   the upper and lower principal surfaces of the multilayer ceramic body being substantially entirely covered with a resin layer;
   a first cutout being formed in a side-edge portion, along the first side surface electrode, of the upper resin layer such that the upper principal-surface electrode is partially exposed in the first cutout;
   a second cutout being formed in a side-edge portion, along the first side surface electrode, of the lower resin layer such that the lower principal-surface electrode is partially exposed in the second cutout; and
   a third cutout being formed in a side-edge portion, along the second side surface electrode, of the upper resin layer such that the lead electrode is exposed in the third cutout, and
   the first and second cutouts formed in the upper and lower resin layers, respectively, are at locations that do not oppose each other.

2. A piezoelectric diaphragm according to claim 1, wherein the multilayer ceramic body has a substantially rectangular shape.

3. A piezoelectric diaphragm according to claim 1, further comprising a case and a lid, wherein the multilayer ceramic body is disposed in the case and sealed in the case by the lid.

4. A piezoelectric diaphragm according to claim 3, wherein the case includes at least one sound hole.

5. A piezoelectric diaphragm according to claim 1, wherein the plurality of piezoelectric ceramic layers are polarized in the same direction.

6. A piezoelectric diaphragm according to claim 1, wherein the internal electrode has a substantially rectangular shape.

7. A piezoelectric diaphragm according to claim 1, further comprising a dummy electrode disposed between at least two adjacent ones of the plurality of piezoelectric ceramic layers.

8. A piezoelectric diaphragm according to claim 7, wherein the dummy electrode has a shape of an incomplete rectangular frame lacking one side.

9. A piezoelectric diaphragm according to claim 7, wherein the dummy electrode is arranged such that three sides of the internal electrode are surrounded by the dummy electrode via a gap.

10. A piezoelectric diaphragm according to claim 7, wherein the dummy electrode is exposed at four side surfaces of the multilayer ceramic body.

11. A piezoelectric diaphragm according to claim 1, wherein each of the upper and lower resin layers is made of a material having a Young's modulus in the range of about 500 MPa to about 15000 MPa.

12. A piezoelectric diaphragm according to claim 1, wherein each of the upper and lower resin layers has a thickness of about 5 μm to about 10 μm.

13. A piezoelectric diaphragm according to claim 1, wherein the first cutout formed in the side-edge portion, along the first side surface electrode, of the upper resin layer is located near one end of the side-edge portion, the second cutout formed in the side-edge portion, along the first side surface electrode, of the lower upper resin layer is located near the opposite end of the side-edge portion, and the third cutout formed in the side-edge portion, along the second side surface electrode, of the upper resin layer is located near either one of the two ends of the side-edge portion.

14. A piezoelectric electroacoustic transducer comprising:
    a piezoelectric diaphragm according to claim 1;
    a housing in which the piezoelectric diaphragm is housed, the housing having a supporting portion for supporting the piezoelectric diaphragm at two opposing sides of the piezoelectric diaphragm or at corners of the piezoelectric diaphragm or over the entire perimeter of the piezoelectric diaphragm, a pair of terminals, one end portion of each terminal being exposed, at a location near the supporting portion, on the inner side wall of the housing, the other end portion of each terminal being exposed on the outer surface of the housing; wherein
    a portion, exposed in the first cutout, of the upper principal-surface electrode is connected to the one end portion of one terminal via a conductive adhesive, and the lead electrode, exposed in the third cutout, is connected to one end portion of the other terminal via a conductive adhesive.

* * * * *